United States Patent
Chen et al.

(10) Patent No.: US 11,164,844 B2
(45) Date of Patent: Nov. 2, 2021

(54) DOUBLE ETCH STOP LAYER TO PROTECT SEMICONDUCTOR DEVICE LAYERS FROM WET CHEMICAL ETCH

(71) Applicant: Taiwan Semiconductor Manufacturing Co., Ltd., Hsin-Chu (TW)

(72) Inventors: Chen Yu Chen, Hsinchu (TW); Ming Chyi Liu, Hsinchu (TW); Eugene Chen, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 56 days.

(21) Appl. No.: 16/568,605

(22) Filed: Sep. 12, 2019

(65) Prior Publication Data

US 2021/0082866 A1 Mar. 18, 2021

(51) Int. Cl.
*H01L 23/00* (2006.01)
*H01L 33/00* (2010.01)
(Continued)

(52) U.S. Cl.
CPC .............. *H01L 24/81* (2013.01); *H01L 24/11* (2013.01); *H01L 24/14* (2013.01); *H01L 24/95* (2013.01);
(Continued)

(58) Field of Classification Search
CPC .............. H01L 21/483; H01L 21/4832; H01L 21/02019; H01L 21/30604–30621;
(Continued)

(56) References Cited

U.S. PATENT DOCUMENTS 5,985,687 A * 11/1999 Bowers ................ H01S 5/0201
438/29
6,258,729 B1 * 7/2001 DeBoer ............. H01L 21/31116
257/E21.008
(Continued)

OTHER PUBLICATIONS

Semiconductor Engineering. "Epitaxy: A method for growing or depositing mono crystalline." Published on Oct. 18, 2018.
(Continued)

*Primary Examiner* — Jarrett J Stark
(74) *Attorney, Agent, or Firm* — Eschweiler & Potashnik, LLC

(57) ABSTRACT

In some embodiments, the present disclosure relates to a method of forming a package assembly. A wet etch stop layer is formed over a frontside of a semiconductor substrate. A sacrificial semiconductor layer is formed over the wet etch stop layer, and a dry etch stop layer is formed over the sacrificial semiconductor layer. A stack of semiconductor device layers may be formed over the dry etch stop layer. A bonding process is performed to bond the stack of semiconductor device layers to a frontside of an integrated circuit die, wherein the frontside of the semiconductor substrate faces the frontside of the integrated circuit die. A wet etching process is performed to remove the semiconductor substrate, and a dry etching process is performed to remove the wet etch stop layer and the sacrificial semiconductor layer.

20 Claims, 10 Drawing Sheets

(51) Int. Cl.
*H01L 33/62* (2010.01)
*H01S 5/18* (2021.01)
*H01L 25/075* (2006.01)

(52) U.S. Cl.
CPC ........ *H01L 25/0756* (2013.01); *H01L 33/005* (2013.01); *H01L 33/62* (2013.01); *H01S 5/18* (2013.01); *H01L 2225/06513* (2013.01)

(58) Field of Classification Search
CPC .......... H01L 21/3063–30635; H01L 21/3065–30655; H01L 21/31055–31056; H01L 21/31111–31122; H01L 21/31133–31138; H01L 21/465; H01L 21/32133–32139; H01L 21/683–68792; H01L 2221/68304–68395; H01L 21/568; H01L 21/31116; H01L 21/31122; H01L 21/67069; H01L 21/32136–32137; H01L 21/02071; H01J 2237/334–3348
See application file for complete search history.

(56) References Cited

U.S. PATENT DOCUMENTS

| | | | | |
|---|---|---|---|---|
| 6,337,265 | B1* | 1/2002 | Trezza | H01L 27/14634 257/E31.096 |
| 6,344,664 | B1* | 2/2002 | Trezza | H01L 25/0753 257/82 |
| 6,503,779 | B2* | 1/2003 | Miyazaki | H01L 23/3107 438/108 |
| 8,895,337 | B1* | 11/2014 | Wang | H01L 33/04 438/47 |
| 2004/0198003 | A1* | 10/2004 | Yeo | H01L 29/785 438/284 |
| 2004/0241958 | A1* | 12/2004 | Guarini | H01L 21/6835 438/455 |
| 2005/0167397 | A1* | 8/2005 | Chen | H01L 21/31144 216/59 |
| 2006/0054595 | A1* | 3/2006 | Starzynski | H01L 21/31111 216/57 |
| 2007/0092995 | A1* | 4/2007 | Datta | C23C 28/34 438/108 |
| 2007/0105320 | A1* | 5/2007 | Yang | H01L 27/1203 438/268 |
| 2008/0149942 | A1* | 6/2008 | Yi | H01L 33/007 257/79 |
| 2008/0149961 | A1* | 6/2008 | Grillot | H01L 33/007 257/99 |
| 2008/0153192 | A1* | 6/2008 | Grillot | H01L 21/0262 438/47 |
| 2009/0017566 | A1* | 1/2009 | Basin | H01L 24/97 438/26 |
| 2009/0280355 | A1* | 11/2009 | Eom | C30B 29/24 428/701 |
| 2010/0224891 | A1* | 9/2010 | Zhang | H01L 33/40 257/94 |
| 2010/0264538 | A1* | 10/2010 | Swinnen | H01L 21/76898 257/737 |
| 2011/0140076 | A1* | 6/2011 | Song | H01L 33/0093 257/13 |
| 2013/0087823 | A1* | 4/2013 | Tsai | H01L 33/38 257/98 |
| 2014/0252446 | A1* | 9/2014 | Bedell | H01L 27/1203 257/316 |
| 2015/0021754 | A1* | 1/2015 | Lin | H01L 23/5389 257/712 |
| 2015/0144974 | A1* | 5/2015 | Chen | H01L 27/15 257/93 |
| 2015/0295154 | A1* | 10/2015 | Tu | H01L 33/0093 438/27 |
| 2017/0163243 | A1* | 6/2017 | Bulger | H03H 9/0576 |
| 2018/0175248 | A1 | 6/2018 | Ahmed | |
| 2019/0013337 | A1 | 1/2019 | Nayak et al. | |
| 2019/0165037 | A1* | 5/2019 | Chae | H01L 33/62 |
| 2020/0006271 | A1* | 1/2020 | Chen | H01L 24/13 |
| 2020/0014169 | A1* | 1/2020 | Yu | H01L 24/81 |
| 2020/0035739 | A1* | 1/2020 | Saito | H01L 27/14605 |
| 2020/0111939 | A1* | 4/2020 | Brodoceanu | B23K 1/203 |
| 2020/0185333 | A1* | 6/2020 | Higashisaka | H01L 21/6835 |
| 2020/0194624 | A1* | 6/2020 | Sheng | H01L 33/44 |
| 2020/0321386 | A1* | 10/2020 | Manda | H01L 27/14623 |
| 2020/0328324 | A1* | 10/2020 | Muller | H01L 33/0095 |
| 2021/0028130 | A1* | 1/2021 | Ida | H01L 21/8222 |

OTHER PUBLICATIONS

Wikipedia.org. "Flip Chip." Published on Jun. 12, 2019.
Zhang et al. "Recent Advances in Flip-Chip Underfill: Materials, Process, and Reliability." IEEE Transactions on Advanced Packaging, vol. 27, No. 3, Aug. 2004.
Wikipedia.org "Light-Emitting Diode." Published on Aug. 3, 2019.
Cooke, Mike. "High-brightness nitride LEDs on silicon through wafer bonding." Semiconductor Today. Published on Jun. 4, 2011.

* cited by examiner

DOUBLE ETCH STOP LAYER TO PROTECT SEMICONDUCTOR DEVICE LAYERS FROM WET CHEMICAL ETCH

BACKGROUND

The semiconductor industry continues to improve the integration density of various electronic components (e.g., transistors, diodes, resistors, capacitors, etc.) by, for example, reducing minimum feature sizes, which allows more components to be integrated into a given area. Smaller package structures, that utilize less area or smaller heights, are developed to package the semiconductor devices. For example, to further increase circuit density per area, flip-chip bonding may be used to vertically couple a semiconductor device to an integrated chip or circuit board through solder bumps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
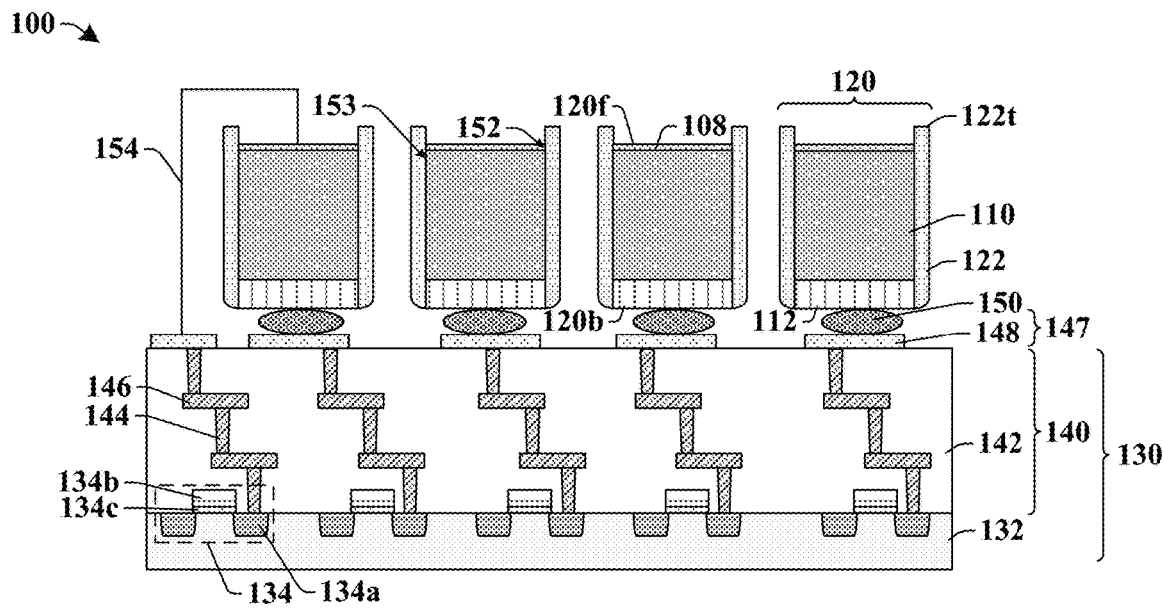
FIG. 1 illustrates a cross-sectional view of some embodiments of a package assembly having semiconductor devices bonded to an integrated circuit die wherein a sidewall protection structure directly and continuously contacts outer sidewalls of the semiconductor devices and a dry etch stop layer that is a dielectric material.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some flip-chip bonding processes may include first forming a stack of semiconductor device layers arranged over a semiconductor substrate. A first etch stop layer may be arranged between the stack of semiconductor device layers and the semiconductor substrate. A bonding structure may be formed over the stack of semiconductor device layers, such that a backside of the bonding structure directly contacts the stack of semiconductor device layers. The semiconductor substrate may then be flipped, and a frontside of the bonding structure may be bonded to an integrated circuit (IC) die via, for example, solder bumps. A sidewall protection structure may be formed along outer sidewalls of the stack of semiconductor device layers to prevent damage to the semiconductor device layers during removal of the semiconductor substrate.

Oftentimes, the semiconductor substrate is subsequently removed using a wet chemical etchant to increase production speed because the wet chemical etchant may remove the semiconductor substrate faster than a dry etchant. Although the first etch stop layer is intended to prevent the wet chemical etchant from removing and/or damaging the semiconductor device layers, the wet chemical etchant may penetrate into the stack of semiconductor device layers via the interface between the sidewall protection structure and the etch stop layer. Damage to the stack of semiconductor device layers may include, for example, cracking at the interface or a change in composition in areas of the stack of semiconductor device layers due to a chemical reaction between the stack of semiconductor device layers and the wet chemical etchant.

Various embodiments of the present application are directed towards two etch stop layers, a wet etching process, and a dry etching process to mitigate damage to the stack of semiconductor device layers when removing the semiconductor substrate. In some embodiments, a first etch stop layer is formed over the semiconductor substrate. A sacrificial semiconductor layer that is thinner than the semiconductor substrate may then be formed over the first etch stop layer, and a second etch stop layer may be deposited over the sacrificial semiconductor layer. Multiple semiconductor layers may be formed over the second etch stop layer to form a stack of semiconductor device layers. A bonding layer may be formed over the stack of semiconductor device layers. The semiconductor substrate may be flipped over an IC die to bond the bonding layer to bonding structures (e.g., solder bumps) of the IC die. To remove the semiconductor substrate and the sacrificial semiconductor layer from the stack of semiconductor device layers, first, a wet etching process may be performed to remove the semiconductor substrate. The first etch stop layer may prevent the wet etching process from continuing past the first etch stop layer. Thus, the first etch stop layer and the sacrificial semiconductor layer protect the stack of semiconductor device layers from the wet etching process. A dry etching process may then be performed to remove the first etch stop layer and the sacrificial semiconductor layer. Because of the sacrificial semiconductor layer, the second etch stop layer, and the dry etching process, damage to the stack of semiconductor device layers by a wet chemical etchant is prevented, thereby producing a reliable semiconductor device bonded to an IC die.

FIG. 1 illustrates a cross-sectional view 100 of some embodiments of a package assembly comprising a dry etch stop layer over a semiconductor device structure bonded to an integrated circuit die.

The package assembly in the cross-sectional view 100 comprises a semiconductor device 120 bonded to an integrated circuit (IC) die 130. In some embodiments, the IC die 130 comprises an interconnect structure 140 disposed over an IC die substrate 132. In some embodiments, the IC die substrate 132 comprises a semiconductor material, and transistor devices 134 are integrated within the IC die substrate 132. For example, in some embodiments, the transistor devices 134 may each be a metal oxide semiconductor field effect transistor (MOSFET) comprising source/drain regions 134a within the IC die substrate 132. Further, the transistor devices 134 may each comprise, in some embodiments, a gate electrode 134b over a gate dielectric layer 134c on the IC die substrate 132 and between the source/drain regions 134a. In some embodiments, the interconnect structure 140 may comprise a network of interconnect wires 146 and interconnect vias 144 embedded in a dielectric structure 142. In some embodiments, the interconnect wires 146 and the interconnect vias 144 are coupled to the transistor devices 134. For example, in the cross-sectional view 100, the interconnect wires 146 and the interconnect vias 144 are coupled to the source/drain regions 134a of the transistor devices 134. In other embodiments (not shown), the interconnect wires 146 and the interconnect vias 144 may be coupled to the gate electrodes 134b of the transistor devices 134. In yet other embodiments (not shown), it will be appreciated that some of the interconnect wires 146 and the interconnect vias 144 may be coupled to the source/drain regions 134a of some of the transistor devices 134, and other interconnect wires 146 and the interconnect vias 144 may be coupled to the gate electrodes 134b of other transistor devices 134.

In some embodiments, the semiconductor devices 120 are bonded to the IC die 130 through a bonding structure 147 comprising, for example, solder bumps 150 disposed over bond pads 148. The bond pads 148 may be bonded to and thus, electrically coupled to the transistor devices 134 through the interconnect structure 140. In some embodiments, the bond pads 148 are arranged over top surfaces of the interconnect structure 140, and the solder bumps 150 are bonded to a backside 120b of the semiconductor devices 120. Further, in some embodiments, some of the bond pads 148 may be coupled to a frontside 120f of the semiconductor devices 120 through other electrical connections 154 (e.g., a wire), such that a bias (e.g., voltage bias) may be applied across the frontside 120f and backside 120b of the semiconductor devices 120 during operation of the semiconductor devices 120.

In some embodiments, each semiconductor device 120 may comprise a stack of semiconductor device layers 110 arranged over a bonding layer 112. The semiconductor device layers 110 may make up various semiconductor devices, such as, for example, a light emitting diode (LED) device, a vertical cavity surface emitting laser (VCSEL) device, a sensor device, or some other semiconductor device. The bonding layer 112 may be bonded to the bonding structure 147. In some embodiments, the package assembly may comprise more than one semiconductor device 120. In such embodiments, each semiconductor device 120 may be electrically isolated from one another, whereas in other embodiments, at least some of the semiconductor devices 120 may be electrically coupled to one another. In some embodiments, a dry etch stop layer 108 may be arranged over the stack of semiconductor device layers 110, and a sidewall protection structure 122 may laterally surround the bonding layer 112, the stack of semiconductor device layers 110, and the dry etch stop layer 108. In some embodiments, the sidewall protection structure 122 may have top surfaces 122t that extend above the dry etch stop layer 108.

In some embodiments, the sidewall protection structure 122 and the dry etch stop layer 108 may surround outer sidewalls and upper surfaces of the stack of semiconductor device layers 110 to protect the stack of semiconductor device layers 110 during manufacturing. In some embodiments, the dry etch stop layer 108 and the sidewall protection structure 122 may comprise a same material that is a dielectric material, such as, for example, silicon oxide, silicon nitride, or silicon oxynitride. An outer sidewall of the dry etch stop layer 108 may directly contact an inner sidewall of the sidewall protection structure 122 at a first interface 152. In some embodiments, the first interface 152 may continuously extend from a top surface of the dry etch stop layer 108 to a bottom surface of the dry etch stop layer 108. In other words, there is no delamination between the sidewall protection structure 122 and the dry etch stop layer 108, in some embodiments. In some embodiments, the lack of delamination between the sidewall protection structure 122 and the dry etch stop layer 108 may be contributed to the sidewall protection structure 122 and the dry etch stop layer 108 both comprising the same or similar dielectric materials. Further, in some embodiments, outer sidewalls of the stack of semiconductor device layers 110 may directly contact the inner sidewall of the sidewall protection structure 122 at a second interface 153. The second interface 153 may continuously extend from a top surface of the stack of semiconductor device layers 110 to a bottom surface of the stack of semiconductor device layers 110. In other words, there is not delamination between the sidewall protection structure 122 and the stack of semiconductor device layers 110, in some embodiments. Thus, the stack of semiconductor device layers 110 may be protected by the sidewall protection structure 122 and the dry etch stop layer 108 to prevent damage to the semiconductor device layers 110 by manufacturing conditions.

Figure 2A:
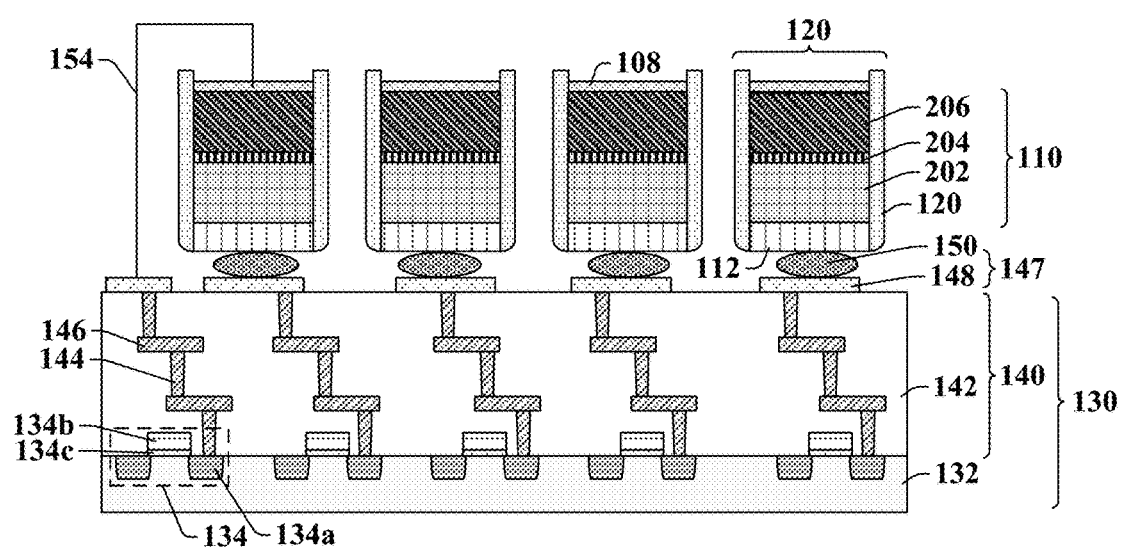
FIGS. 2A and 2B illustrate cross-sectional views of some more detailed embodiments of the package assembly of FIG. 1 in which the semiconductor devices correspond to light emitting diodes (LEDs) and vertical cavity surface emitting lasers (VCSELs).

FIG. 2A illustrates a cross-sectional view 200A of some embodiments of a package assembly comprising a light emitting diode (LED) device bonded to an integrated circuit die.

In some embodiments, the semiconductor device 120 may be or comprise a LED device. In such embodiments, the stack of semiconductor device layers 110 may comprise a first semiconductor region 202 having a first doping type (e.g., n-type) and a second semiconductor region 206 having a second doping type (e.g., p-type) arranged over the first semiconductor region 202. An active region 204 may be arranged between the first and second semiconductor regions 202, 206. For example, the first semiconductor region 202 may comprise n-type gallium nitride, the second semiconductor region 206 may comprise p-type gallium nitride, and the active region 204 may comprise indium gallium nitride. Due to a bias applied across the stack of semiconductor device layers 110, in a LED device, electron-hole recombination at the active region 204 the LED device may emit colored light.

Figure 2B:
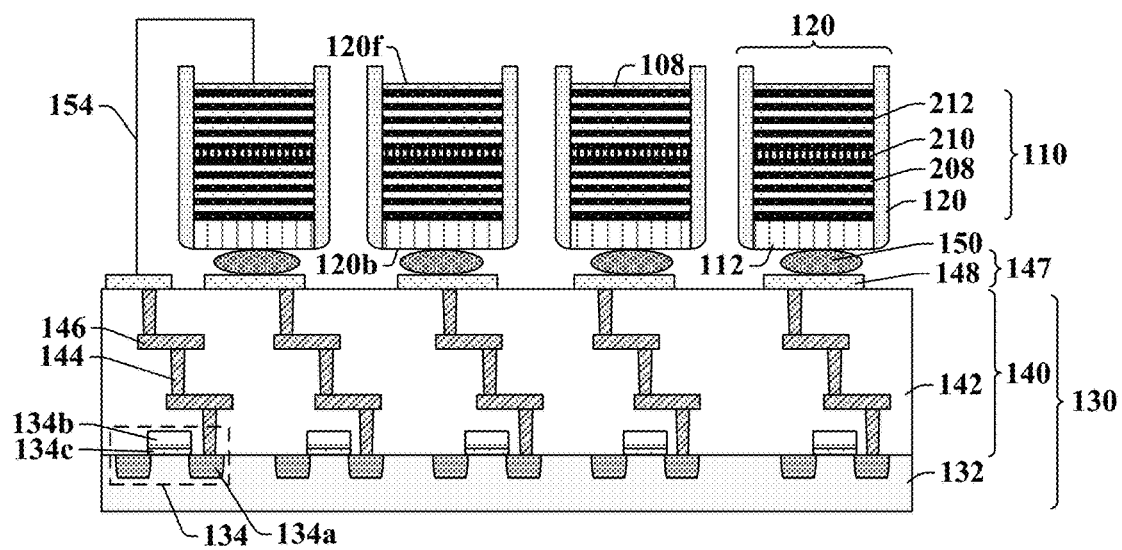

FIG. 2B illustrate a cross-sectional view 200B of some embodiments of a package assembly comprising a vertical cavity surface emitting laser (VCSEL) device bonded to an integrated circuit die.

In some embodiments, the semiconductor device 120 may comprise a VCSEL device. In such embodiments, the stack of semiconductor device layers 110 may comprise a plurality of first reflector layers 208 and a plurality of second reflector layers 212 that are alternatingly stacked. An optically active region 210 may be arranged between the alternating layers of the first and second reflector layers 208, 212. For example, in some embodiments, the first reflector layers 208 may comprise aluminum gallium arsenide and the second reflector layers 212 may comprise gallium arsenide. The optically active region 210 may emit light upon a bias applied across the stack of semiconductor device layers 110, and the light may reflect through the first and second reflector layers 208, to emit a focused laser through the frontside 120f of the semiconductor device 120. Thus, in some embodiments, to allow the focused laser to exit the frontside 120f of the semiconductor device 120, the dry etch stop layer 108 may be transparent; or in other embodiments, after bonding the semiconductor devices 120 to the IC die 130, a portion of the dry etch stop layer 108 may be removed. Nevertheless, during the manufacturing process of bonding the semiconductor devices 120 to the IC die 130, the dry etch stop layer 108 and the sidewall protection structure 122 protect the stack of semiconductor device layers 110 from damage.

FIGS. 3-13 illustrate cross-sectional views 300-1300 of some embodiments of a method of forming a package assembly using a dry etch stop layer and a wet etch stop layer on a semiconductor device. Although FIGS. 3-13 are described in relation to a method, it will be appreciated that the structures disclosed in FIGS. 3-13 are not limited to such a method, but instead may stand alone as structures independent of the method.

Figure 3:
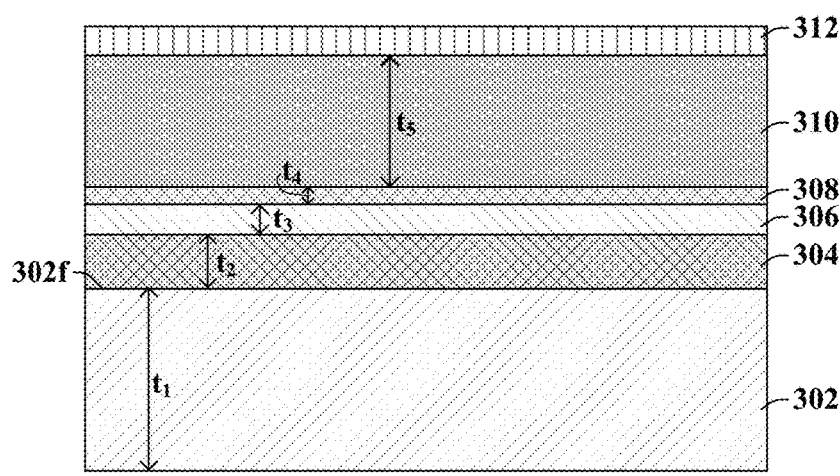
FIGS. 3-13 illustrate cross-sectional views of some embodiments of a method of bonding a semiconductor device to an integrated circuit die using a flip-chip bonding process including a wet etching process and a dry etching process.

As shown in the cross-sectional view 300 of FIG. 3, a semiconductor substrate 302 is provided. In some embodiments, the semiconductor substrate 302 may comprise a semiconductor material, such as, for example gallium arsenide. In some embodiments, the semiconductor substrate 302 may have a first thickness $t_1$ that is greater than, for example, approximately 600 micrometers. On a frontside 302f of the semiconductor substrate 302, a wet etch stop layer 304 may be formed. In some embodiments, the wet etch stop layer 304 may comprise, for example, indium gallium phosphorous, indium phosphorous, indium gallium arsenic phosphorous, or the like. Thus, in some embodiments, the wet etch stop layer 304 may comprise a semiconductor material. The wet etch stop layer 304 may have a second thickness $t_2$, in some embodiments, that is equal to at most, for example, 40 micrometers. The second thickness $t_2$ of the wet etch stop layer 304 must be thick enough to resist a wet etchant from a wet etching process (see, 1102 of FIG. 11). In some embodiments, the wet etch stop layer 304 may be formed by way of vapor deposition processes (e.g., chemical vapor deposition (CVD), physical vapor deposition (PVD), atomic layer deposition (ALD), etc.) or may be formed by an epitaxial growth or deposition process.

On the wet etch stop layer 304, a sacrificial semiconductor layer 306 may be formed. In some embodiments, the sacrificial semiconductor layer 306 may comprise gallium arsenide, and thus, comprise a same semiconductor material as the semiconductor substrate 302. In some embodiments, the sacrificial semiconductor layer 306 may have a third thickness $t_3$ that is at most, for example, 1 micrometer. Thus, the sacrificial semiconductor layer 306 may be thinner than the semiconductor substrate 302 (e.g., $t_3$ is less than $t_1$), which allows the sacrificial semiconductor layer 306 to be more efficiently removed by a dry etching process (see, 1202 of FIG. 12) than the semiconductor substrate 302. In some embodiments, the sacrificial semiconductor layer 306 may be a substrate and thus, may be bonded to a top surface of the wet etch stop layer 304 and thinned by a chemical mechanical polish (CMP) or some other suitable thinning process. In alternative embodiments, the sacrificial semiconductor layer 306 may be formed by way of an epitaxial growth process. Thus, in some embodiments, the wet etch stop layer 304 is or comprises a semiconductor material to facilitate epitaxial growth or deposition of the sacrificial semiconductor layer 306.

On the sacrificial semiconductor layer 306, a dry etch stop layer 308 may be deposited. In some embodiments, the dry etch stop layer 308 may comprise a dielectric material, such as, for example, silicon dioxide, silicon nitride, or silicon oxynitride. Thus, the dry etch stop layer 308 may comprise a different material than the wet etch stop layer 304. In some embodiments, the dry etch stop layer 308 may have a fourth thickness $t_4$ that is at most, for example, 70 nanometers. Thus, in some embodiments, the dry etch stop layer 308 may be thinner than the wet etch stop layer 304, whereas in other embodiments, the dry etch stop layer 308 may be about equal in thickness or thicker than the wet etch stop layer 304. In some embodiments, if the dry etch stop layer 308 is greater than 70 nanometers, it may negatively impact manufacturing time. However, if the dry etch stop layer 308 is too thin (e.g., less than 10 nanometers), it may not be able to resist a dry etching process (see, 1202 of FIG. 12), and thus, would not function as an etch stop layer in some embodiments. In some embodiments, the dry etch stop layer 308 may be deposited by way of vapor deposition processes (e.g., chemical vapor deposition (CVD), physical vapor deposition (PVD), atomic layer deposition (ALD), etc.).

On the dry etch stop layer 308, semiconductor device layers 310 may be formed, such that a backside of the semiconductor device layers 310 contact the dry etch stop layer 308. The semiconductor device layers 310 may comprise many layers of various semiconductor materials, depending on a desired application. For example, in some embodiments, the semiconductor device layers 310 may comprise layers for a sensor, an LED device (see, FIG. 2A), or a VCSEL device (see, FIG. 2B). In some embodiments, the semiconductor device layers 310 may have a thickness that is in a range of between, for example, approximately 10 micrometers and approximately 15 micrometers. In some embodiments, the semiconductor device layers 310 may be formed by way of an epitaxial deposition process.

On the semiconductor device layers 310, in some embodiments, a bonding layer 312 may be deposited. In some embodiments, the bonding layer 312 comprises an electrically conductive material that is also subject to a soldering process (see, FIGS. 8-10) such as for example, nickel or gold. In some embodiments, the bonding layer 312 may be deposited by way of vapor deposition processes (e.g., chemical vapor deposition (CVD), physical vapor deposition (PVD), atomic layer deposition (ALD), sputtering, etc.).

Figure 4:
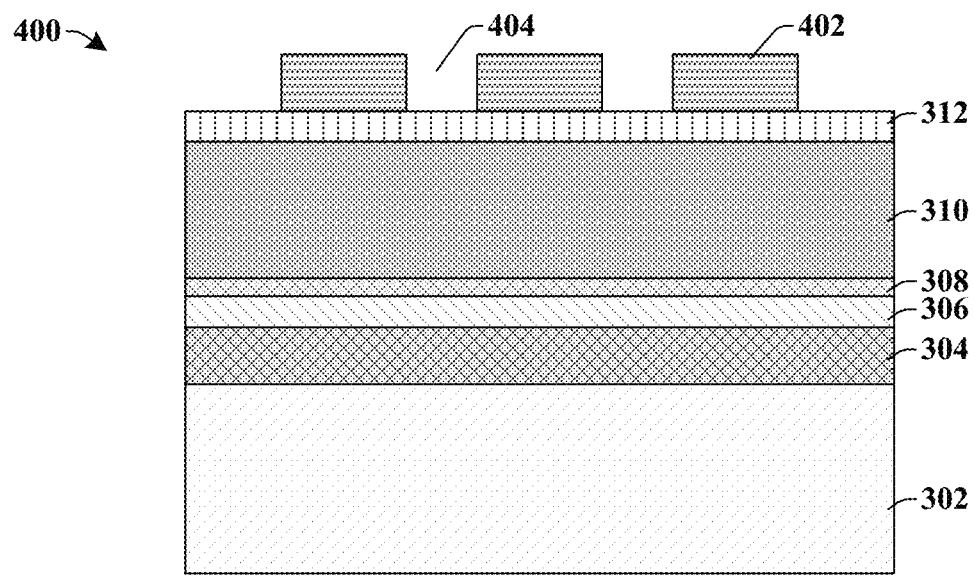

As shown in the cross-sectional view 400 of FIG. 4, a masking layer 402 may be deposited and patterned over the bonding layer 312, in some embodiments. The masking layer 402 may be patterned to comprise multiple segments, according to how many semiconductor devices are to be formed for an application. For example, in some embodiments, the masking layer 402 may comprise a photosensitive material (e.g., photoresist) formed by a spin coating process. In such embodiments, the layer of photosensitive material is selectively expose to electromagnetic radiation according to a photomask or photoreticle. The electromagnetic radiation modifies a solubility of exposed regions within the photosensitive material to define soluble regions. The photosensitive material is subsequently developed to define openings 404 within the photosensitive material by removing the soluble regions. In other embodiments, the masking layer 402 may comprise a hard mask layer (e.g., a silicon nitride layer, a silicon carbide layer, or the like).

Figure 5:
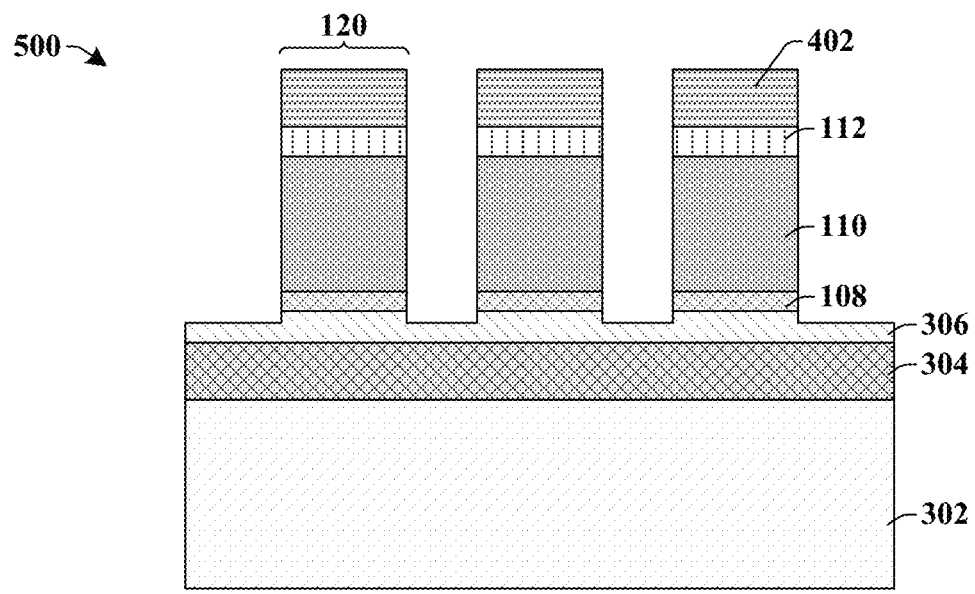

As shown in the cross-sectional view 500 of FIG. 5, a first etching process is performed according to the openings (404 of FIG. 4) in the masking layer 402 to pattern the semiconductor device layers (310 of FIG. 4) into, for example, three semiconductor devices 120, each of which comprise a stack of semiconductor device layers 110 between a bonding layer 112 and a dry etch stop layer 108. It will be appreciated that the number of semiconductor devices 120 may be less than or greater than three and is dependent on parameters of the desired application of the package assembly. In some embodiments, the first etching process uses multiple etchants to target each material of the bonding layer 112, the stack of semiconductor device layers 110, and the dry etch stop layer 108. Further, in some embodiments, the first etching process may continue into the sacrificial semiconductor layer 306, but the first etching process does not continue completely through the thickness of the sacrificial semiconductor layer 306. Thus, in some embodiments, after the first etching process, the sacrificial semiconductor layer 306 may connect each semiconductor device 120 to one another.

Figure 6:
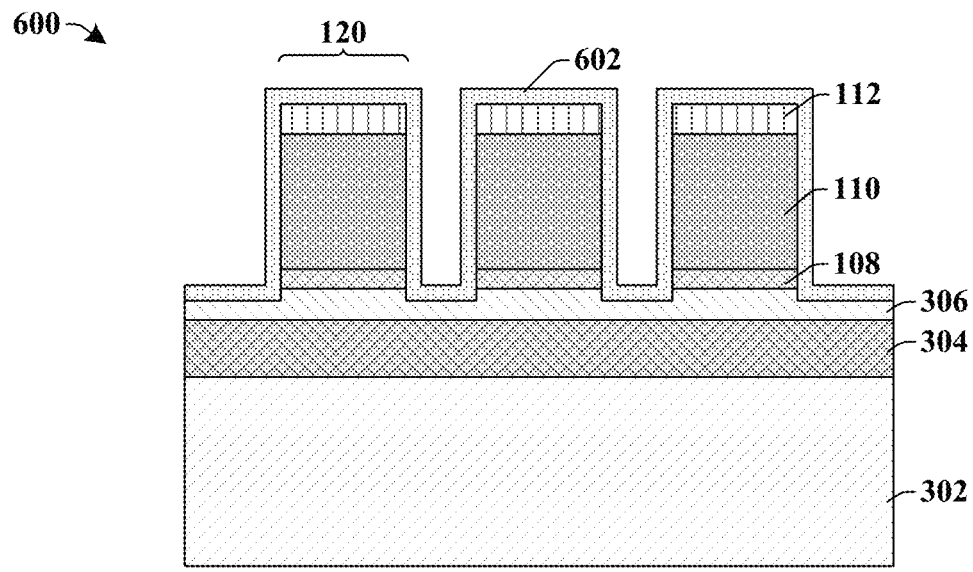

As shown in the cross-sectional view 600 of FIG. 6, in some embodiments, a dielectric layer 602 is deposited on the semiconductor devices 120 and the sacrificial semiconductor layer 306. The dielectric layer 602 may comprise a dielectric material, such as, for example, silicon dioxide, silicon nitride, or silicon oxynitride. Thus, in some embodiments, the dielectric layer 602 may comprise a same material as the dry etch stop layer 108. In some embodiments, the dielectric layer 602 may have a thickness in a range of between, for example, approximately 100 nanometers and approximately 130 nanometers. In other embodiments, the thickness of the dielectric layer 602 may be greater than 130 nanometers, for example. In some embodiments, the dielectric layer 602 may be deposited by way of vapor deposition processes (e.g., chemical vapor deposition (CVD), physical vapor deposition (PVD), atomic layer deposition (ALD), sputtering, etc.). The dielectric layer 602 may directly and continuously contact outer surfaces of each dry etch stop layer 108 and each stack of semiconductor device layers 110.

Figure 7:
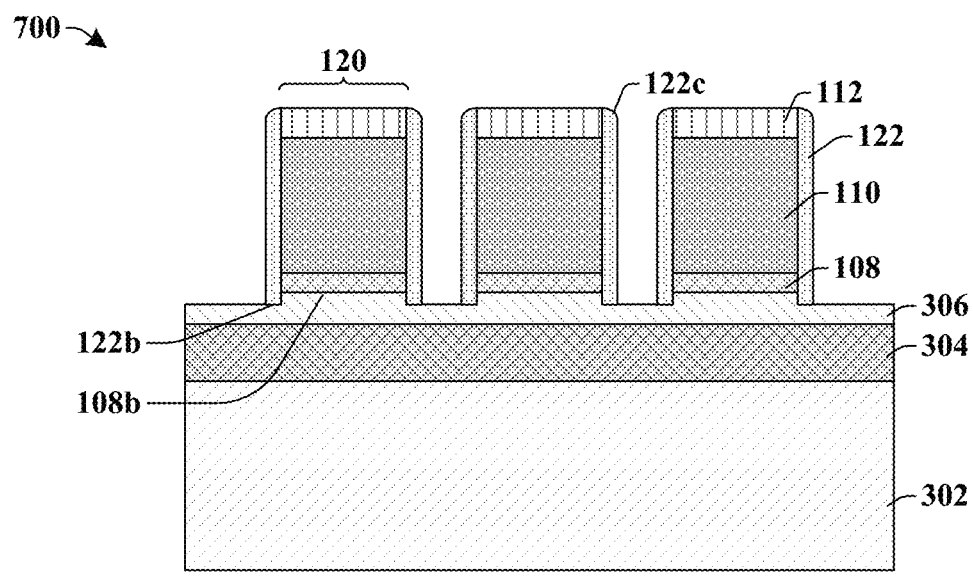

As shown in the cross-sectional view 700 of FIG. 7, a second etching process may be performed to remove horizontal portions of the dielectric layer (602 of FIG. 6) to form a sidewall protection structure 122 on each semiconductor device 120. In some embodiments, the second etching process is a vertical etch, such that the horizontal portions of the dielectric layer (602 of FIG. 6) may be removed without the use of a masking layer. In some embodiments, the sidewall protection structure 122 may have, from the perspective of the cross-sectional view 700 of FIG. 7, upper corners 122c that are substantially rounded. Further, in some embodiments, from the perspective of the cross-sectional view 700 of FIG. 7, the sidewall protection structure 122 may have a bottommost surface 122b that is lower than a bottommost surface 108b of the dry etch stop layer 108.

Figure 8:
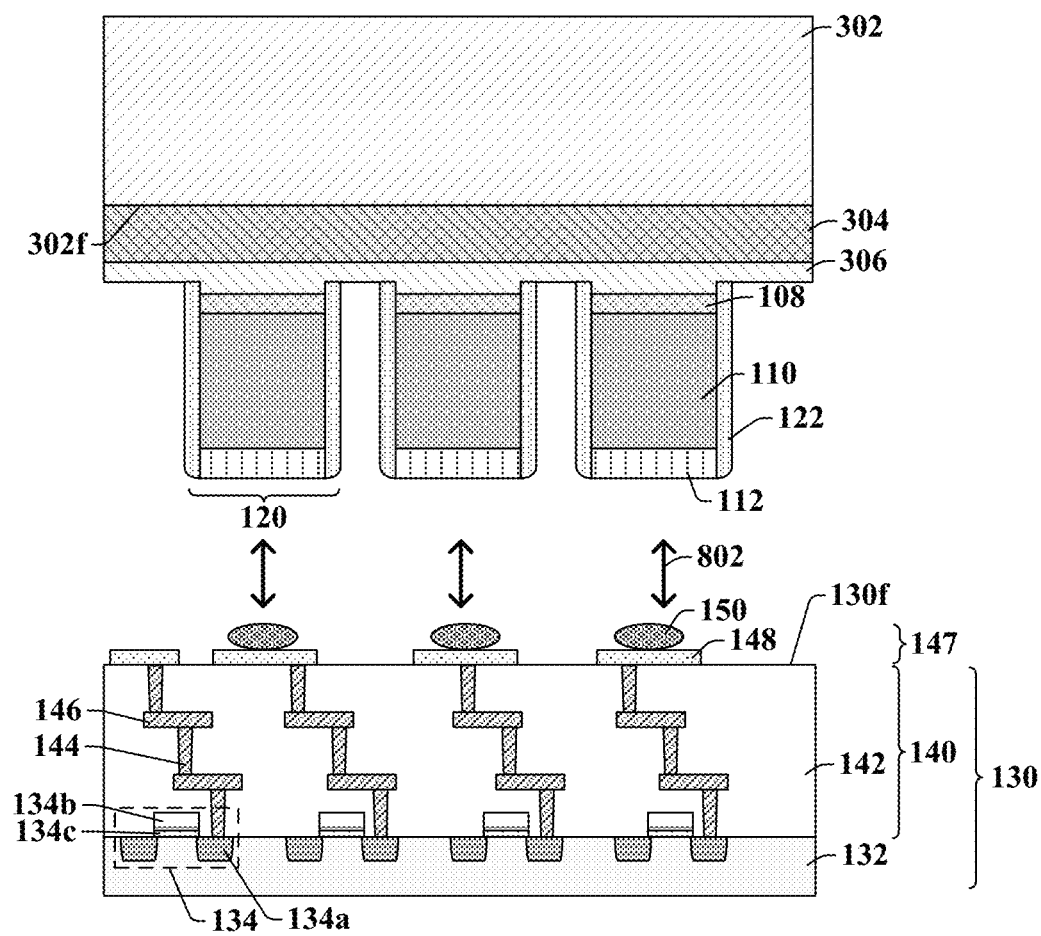

As shown in the cross-sectional view 800 of FIG. 8, the semiconductor substrate 302 is flipped, such that the frontside 302f of the semiconductor substrate 302 is facing a frontside 130f of an integrated circuit (IC) die 130. The IC die 130 may comprise transistor devices 134 integrated in an IC die substrate 132. In some embodiments, the IC die substrate 132 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the transistor devices 134 comprise source/drain regions 134a in the IC die substrate 132, and a gate electrode 134b arranged on the IC die substrate 132 and between the source/drain regions 134a. In some embodiments, a gate dielectric layer 134c separates the gate electrode 134b from the IC die substrate 132. An interconnect structure 140 comprising interconnect wires 146 and interconnect vias 144 embedded in a dielectric structure 142 may be formed over the IC die substrate 132. In some embodiments, the dielectric structure 142 may comprise a ceramic material such as, for example, silicon carbide, aluminum oxide, silicon boride, or the like. The interconnect wires 146 and the interconnect vias 144 may comprise a conductive material such as, for example, copper or tungsten. The interconnect wires 146 and interconnect vias 144 may couple the transistor devices 134 to a bonding structure 147 on the frontside 130f of the IC die 130. In some embodiments, the bonding structure 147 comprises bond pads 148, and each bond pad 148 may be coupled to each transistor device 134. In some embodiments, solder bumps 150 may be deposited on the bond pads 148 to be bonded to the semiconductor devices 120. In some embodiment, the bond pads 148 may comprise a conductive material such as, for example, copper, tungsten, aluminum, nickel, or gold. In some embodiments, the solder bumps 150 may comprise, for example, nickel or gold.

In some embodiments, each of the semiconductor devices 120 may be aligned over one of the solder bumps 150. Thus, in some embodiments, the semiconductor devices 120 may have a same or about the same pitch as each of the solder bumps 150. A bonding process 802 may then begin, which may first begin with the semiconductor substrate 302 moving towards the IC die 130. The bonding process 802 may then continue to FIG. 9.

Figure 9:
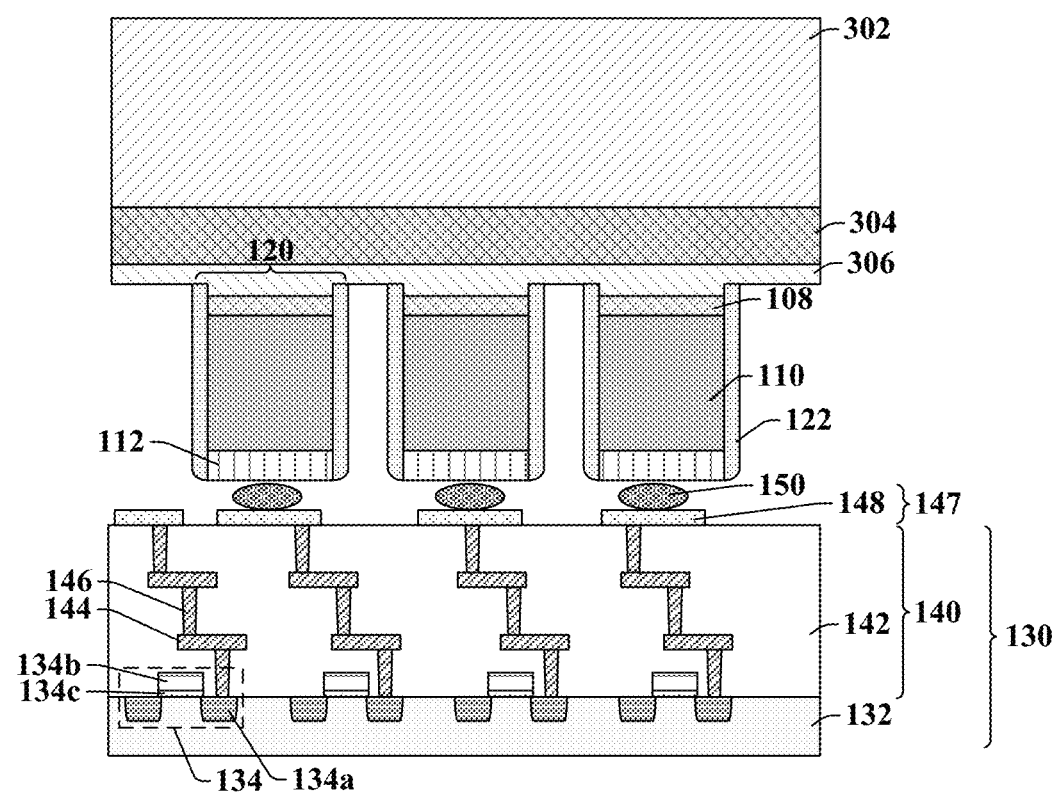

As shown in the cross-sectional view 900 of FIG. 9, the bonding layers 112 are in contact with the solder bumps 150. In some embodiments, the bonding process (802 of FIG. 8) may include a heating process wherein the solder bumps 150 are heated enough such that the solder bumps 150 bond to the bonding layer 112.

Figure 10:
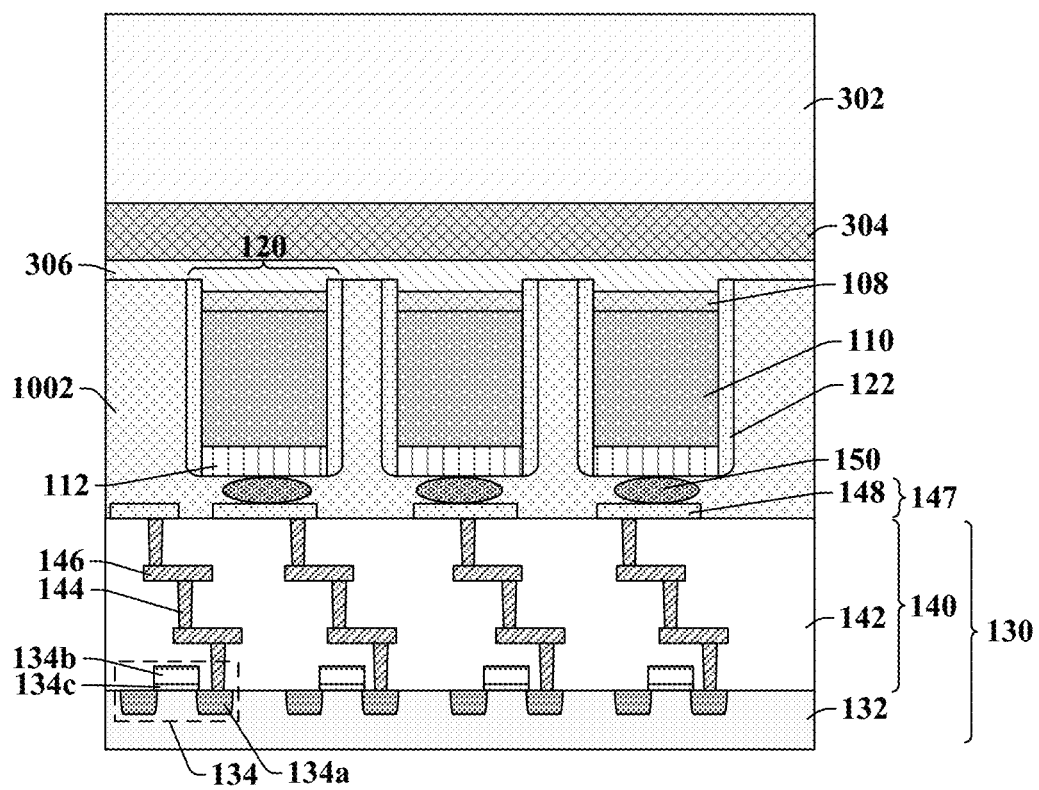

As shown in the cross-sectional view 1000 of FIG. 10, the bonding process (802 of FIG. 8) may continue with the injection of an underfill material 1002 between the sacrificial semiconductor layer 306 and the IC die 130. The underfill material 1002 may also be injected between adjacent semiconductor devices 120. In some embodiments, the underfill material 1002 is an epoxy resin that has a high coefficient of thermal expansion. A thermal-compression process may then be conducted to reinforce and mechanically stabilize the bond between the solder bumps 150 and the bonding layer 112.

Figure 11:
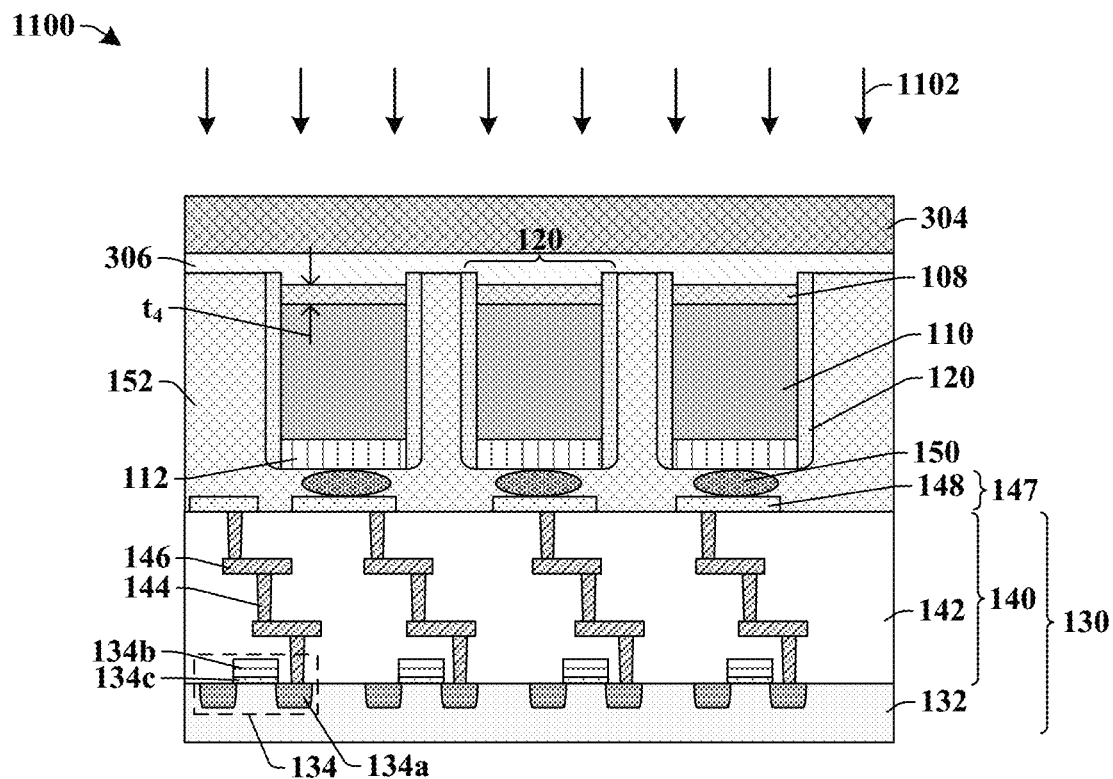

As shown in the cross-sectional view 1100 of FIG. 11, a wet etching process 1102 may be performed using a wet chemical etchant to remove the semiconductor substrate (302 of FIG. 10). Because the semiconductor substrate (302 of FIG. 10) is very thick (e.g., greater than 100 micrometers), the wet etching process 1102 is used for a time efficient manufacturing process. The wet etching process 1102 is substantially selective to removal of the semiconductor substrate (302 of FIG. 10) and is substantially not selective to removal of the wet etch stop layer 304. Thus, the wet etch stop layer 304 prevents the wet chemical etchant of the wet etching process 1102 from penetrating into the sacrificial semiconductor layer 306. In some embodiments, the wet chemical etchant may comprise sulfuric acid, citric acid, or hydrogen peroxide, for example. In some embodiments, after the wet etching process 1102, the wet etch stop layer 304 may be thinner. However, in other embodiments, the composition of the wet etch stop layer 304 may be so resistant to the wet chemical etchant of the wet etching process 1102 that the wet etch stop layer 304 remains unaffected by the wet etching process 1102.

Figure 12:
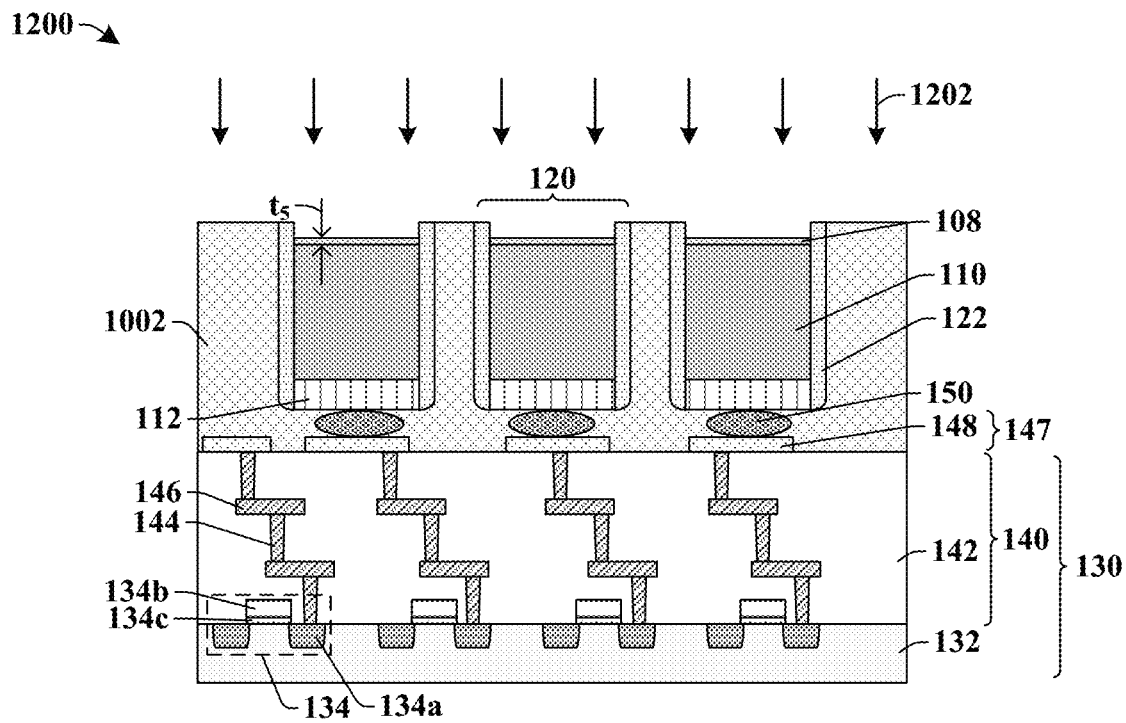

As shown in the cross-sectional view 1200 of FIG. 12, a dry etching process 1202 may be performed using dry etchants to remove the wet etch stop layer (304 of FIG. 11) and the sacrificial semiconductor layer (306 of FIG. 11). Because the wet etch stop layer (304 of FIG. 11) and the sacrificial semiconductor layer (306 of FIG. 11) are thin enough (e.g., less than 100 micrometers), the dry etching process 1202 may be used without significant use of manufacturing time. In some embodiments, the dry etching process 1202 first uses a first dry etchant to remove the wet etch stop layer (304 of FIG. 11). For example, in some embodiments, the first dry etchant comprises a fluoride based gas, such as a carbon fluoride compound (e.g., $CF_4$, $C_4F_8$, $CHF_3$, etc.). In some embodiments, the sacrificial semiconductor layer (306 of FIG. 11) may resist removal by the first dry etchant. Thus, after the wet etch stop layer (304 of FIG. 11) is removed by the first dry etchant, the dry etching process 1202 may then use a second dry etchant to remove the sacrificial semiconductor layer (306 of FIG. 11). For example, in some embodiments, the second dry etchant may comprise a chlorine based gas, such as chlorine gas ($Cl_2$) or boron chloride ($BCl_3$). To prevent the dry etchant from removing the dry etch stop layer 108 from covering and protecting the stack of semiconductor device layers 110, the dry etch stop layer 108 comprises a different material than the sacrificial semiconductor layer (306 of FIG. 11), and the dry etch stop layer 108 is resistant to the second dry etchant. In some embodiments, an amount of the dry etch stop layer 108 may be removed during the dry etching process 1202. For example, in some embodiments, the dry etch stop layer 108 may have the fourth thickness (see, $t_4$ of FIGS. 3 and 11) before the dry etching process 1202, and after the dry etching process 1202, the dry etch stop layer 108 may have a fifth thickness $t_5$ that is less than the fourth thickness ($t_4$ of FIG. 11). However, the more resistant the dry etch stop layer 108 is to the second dry etchant, the less the difference is between the fourth thickness ($t_4$ of FIG. 11) and the fifth thickness $t_5$ and the smoother the top surface is of the dry etch stop layer 108. In some embodiments, the sidewall protection structure 122 also comprises a same material as the dry etch stop layer 108. Thus, in some embodiments, the sidewall protection structure 122 is also substantially resistant to the second etchant of the dry etching process 1202. Thus, the sidewall protection structure 122 and the dry etch stop layer 108 may both protect the stack of semiconductor device layers 110 from damage by the dry etching process 1202. Further, because the dry etching process 1202 is used instead of a wet etching process (e.g., 1102 of FIG. 11) to remove the sacrificial semiconductor layer (306 of FIG. 11), thereby exposing the dry etch stop layer 108, damage by delamination between the sidewall protection structure 122, the dry etch stop layer 108, and the stack of semiconductor device layers 110 is prevented. Further, delamination may also be mitigated because the sidewall protection structure 122 and the dry etch stop layer 108 may both a same dielectric material, which may cause delamination to be more difficult than if the sidewall protection structure 122 and the dry etch stop layer 108 comprised different materials. Thus, in some embodiments, the stack of semiconductor device layers 110 may have a first concentration of defects before the wet etching process (1102 of FIG. 11) and a second concentration of defects after the dry etching process 1202. The first concentration of defects may equal the second concentration of defects because the stack of semiconductor device layers 110 are protected by the dry etch stop layer 108 and the sidewall protection structure 122. Further, because delamination is prevented, other damage to the semiconductor device layers 110 may be prevented, such as a chemical reaction between etchants of the wet and dry etching processes 1102, 1202 and the stack of semiconductor device layers 110.

Figure 13:
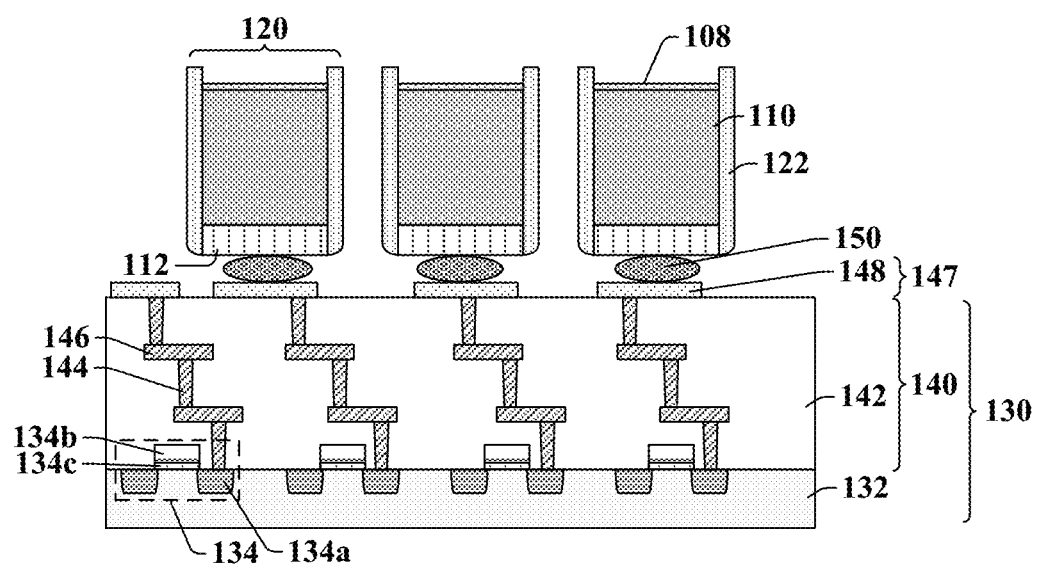

As shown in the cross-sectional view 1300 of FIG. 13, in some embodiments, the underfill material 1002 may be removed. In some embodiments, the underfill material 1002 may be removed by a solvent. Further, after the removal of the underfill material 1002, more patterning and/or electrical connections (e.g., 154 of FIG. 1) may be conducted to produce a package assembly comprising functional semiconductor devices 120.

Figure 14:
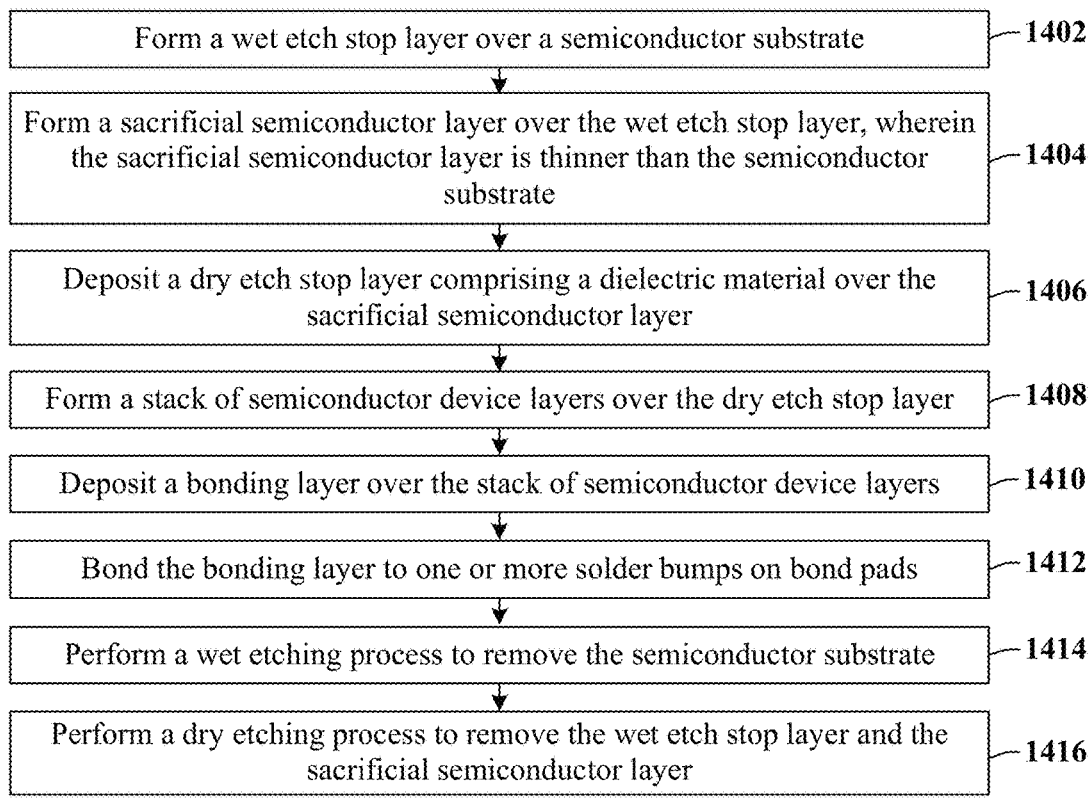
FIG. 14 illustrates a flow diagram of some embodiments of a method corresponding to FIGS. 3-13.

FIG. 14 illustrates a flow diagram of some embodiments of a method 1400 corresponding to FIGS. 3-13.

While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1402, a wet etch stop layer is formed over a semiconductor substrate.

At act 1404, a sacrificial semiconductor layer is formed over the wet etch stop layer, wherein the sacrificial semiconductor layer is thinner than the semiconductor substrate.

At act 1406, a dry etch stop layer comprising a dielectric material is deposited over the sacrificial semiconductor layer.

At act 1408, a stack of semiconductor device layers is formed over the dry etch stop layer.

At act 1410, a bonding layer is deposited over the stack of semiconductor device layers. FIG. 3 illustrates cross-sectional view 300 of some embodiments corresponding to acts 1402, 1404, 1406, 1408, and 1410.

At act 1412, the bonding layer is bonded to one or more solder bumps on bond pads. FIGS. 8-10 illustrate cross-sectional views 800-1000 of some embodiments corresponding to act 1412.

At act 1414, a wet etching process is performed to remove the semiconductor substrate. FIG. 11 illustrates cross-sectional view 1100 of some embodiments corresponding to act 1414.

At act 1416, a dry etching process is performed to remove the wet etching stop layer and the sacrificial semiconductor layer. FIG. 12 illustrates cross-sectional view 1200 of some embodiments corresponding to act 1416.

Therefore, the present disclosure relates to a method of forming a package assembly using a wet etching process followed by a dry etching process to remove sacrificial substrate layers from a stack of semiconductor layers without damaging the semiconductor layers with a wet chemical etchant.

Accordingly, in some embodiments, the present disclosure relates to a method of forming a package assembly, comprising: forming a wet etch stop layer over a frontside of a semiconductor substrate; forming a sacrificial semiconductor layer over the wet etch stop layer; forming a dry etch stop layer over the sacrificial semiconductor layer; forming a stack of semiconductor device layers over the dry etch stop layer; performing a bonding process to bond the stack of semiconductor device layers to a frontside of an integrated circuit die, wherein the frontside of the semiconductor substrate faces the frontside of the integrated circuit die; performing a wet etching process to remove the semiconductor substrate; and performing a dry etching process to remove the wet etch stop layer and the sacrificial semiconductor layer.

In other embodiments, the present disclosure relates to a method of forming a package assembly, comprising: forming a first etch stop layer over a semiconductor substrate; forming a sacrificial semiconductor layer over the first etch stop layer, wherein the sacrificial semiconductor layer is thicker than the semiconductor substrate; forming a second etch stop layer over the sacrificial semiconductor layer; forming a stack of device layers over the second etch stop layer, wherein a backside of stack of device layers contacts the second etch stop layer; bonding a frontside of the stack of device layers to an integrated circuit die; performing a wet etching process to remove the semiconductor substrate; and performing a dry etching process to remove the first etch stop layer and the sacrificial semiconductor layer.

In yet other embodiments, the present disclosure relates to a package assembly comprising: an integrated circuit die comprising a metal interconnect structure over a substrate; a semiconductor device arranged over and electrically coupled to the metal interconnect structure; an etch stop layer arranged over the semiconductor device, wherein the etch stop layer comprises a dielectric material; and a sidewall protection structure surrounding the semiconductor device, wherein an uppermost surface of the sidewall protection structure is above the etch stop layer, wherein the sidewall protection structure has an inner sidewall that directly and continuously contacts an outer sidewall of the etch stop layer from a top surface of the etch stop layer to a bottom surface of the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package assembly, comprising:
forming a wet etch stop layer over a frontside of a semiconductor substrate;
forming a sacrificial semiconductor layer over the wet etch stop layer;
forming a dry etch stop layer over the sacrificial semiconductor layer;
forming a stack of semiconductor device layers over the dry etch stop layer;
performing a bonding process to bond the stack of semiconductor device layers to a frontside of an integrated circuit die, wherein the frontside of the semiconductor substrate faces the frontside of the integrated circuit die;
depositing an underfill material between the sacrificial semiconductor layer and the integrated circuit die after the bonding process;
performing a wet etching process to remove the semiconductor substrate after the depositing of the underfill material;
performing a dry etching process to remove the wet etch stop layer and the sacrificial semiconductor layer; and
completely removing the underfill material after the dry etching process.

2. The method of claim 1, wherein the semiconductor substrate is thicker than the sacrificial semiconductor layer.

3. The method of claim 1, further comprising:
patterning the stack of semiconductor device layers and the dry etch stop layer to form a first semiconductor device and a second semiconductor device laterally separated from the first semiconductor device, wherein after the patterning, the first semiconductor device and the second semiconductor device are connected by the sacrificial semiconductor layer.

4. The method of claim 1, wherein the dry etch stop layer is thinner after the dry etching process than before the dry etching process.

5. The method of claim 1, further comprising:
forming a sidewall protection structure on outer sidewalls of the stack of semiconductor device layers before the performing of the wet etching process.

6. The method of claim 5, wherein after performing the dry etching process, the sidewall protection structure has a top surface above a topmost surface of the dry etch stop layer.

7. The method of claim 5, wherein the dry etch stop layer is in direct contact with the sidewall protection structure at an interface, and wherein the interface continuously extends from a top surface of the dry etch stop layer to a bottom surface of the dry etch stop layer.

8. The method of claim 5, wherein the sidewall protection structure completely surrounds the outer sidewalls of the stack of semiconductor device layers, comprises a same dielectric material as the dry etch stop layer, and directly contacts the stack of semiconductor device layers.

9. A method of forming a package assembly, comprising:
forming a first etch stop layer over a semiconductor substrate;
forming a sacrificial semiconductor layer over the first etch stop layer, wherein the sacrificial semiconductor layer is thinner than the semiconductor substrate;
forming a second etch stop layer over the sacrificial semiconductor layer;
forming a stack of device layers over the second etch stop layer, wherein a backside of the stack of device layers contacts the second etch stop layer;
forming a sidewall protection structure completely covering outermost sidewalls of the stack of device layers, wherein the sidewall protection structure comprises a same dielectric material as the second etch stop layer;
bonding a frontside of the stack of device layers to an integrated circuit die;
performing a wet etching process to remove the semiconductor substrate; and performing a dry etching process to completely remove the first etch stop layer and the sacrificial semiconductor layer.

10. The method of claim 9, wherein the first etch stop layer is thicker than the second etch stop layer.

11. The method of claim 9, wherein after the dry etching process, the second etch stop layer completely covers the backside of the stack of device layers.

12. The method of claim 9, wherein the dry etching process uses a first dry etchant to remove the first etch stop layer and a second dry etchant different than the first dry etchant to remove the sacrificial semiconductor layer.

13. The method of claim 9, wherein the stack of device layers has a first concentration of defects before the wet etching process, wherein the stack of device layers has a second concentration of defects after the dry etching process, and wherein the first concentration is equal to the second concentration.

14. The method of claim 9, wherein a bottommost surface of the sidewall protection structure is arranged between a topmost surface of the sacrificial semiconductor layer and a bottommost surface of the sacrificial semiconductor layer when the sacrificial semiconductor layer is arranged over the first etch stop layer.

15. The method of claim 9, wherein the sidewall protection structure directly contacts the stack of device layers.

16. A method comprising:
   forming a wet etch stop layer over a semiconductor substrate;
   forming a sacrificial semiconductor layer over the wet etch stop layer;
   forming a dry etch stop layer over the sacrificial semiconductor layer;
   forming a stack of semiconductor device layers over the dry etch stop layer;
   forming a bonding layer over the stack of semiconductor device layers;
   forming a sidewall protection structure on outer sidewalls of the bonding layer, the dry etch stop layer, and the stack of semiconductor device layers before bonding the bonding layer, wherein an inner sidewall of the sidewall protection structure directly contacts the outer sidewalls of the stack of semiconductor device layers at an interface, wherein the interface continuously extends from a topmost surface of the stack of semiconductor device layers to a bottommost surface of the stack of semiconductor device layers, and wherein the sidewall protection structure is completely spaced apart from the wet etch stop layer by the sacrificial semiconductor layer;
   bonding the bonding layer to one or more bonding structures arranged over a substrate different than the semiconductor substrate;
   performing a wet etching process to remove the semiconductor substrate; and
   performing a dry etching process to completely remove the wet etch stop layer and the sacrificial semiconductor layer.

17. The method of claim 16, wherein the sacrificial semiconductor layer is thinner than the semiconductor substrate.

18. The method of claim 16, further comprising:
   patterning the bonding layer, the stack of semiconductor device layers, and the dry etch stop layer to form a first semiconductor device and a second semiconductor device laterally separated from the first semiconductor device, wherein the first semiconductor device and the second semiconductor device are connected by the sacrificial semiconductor layer.

19. The method of claim 16, wherein the dry etch stop layer and the sidewall protection structure comprise a same dielectric material.

20. The method of claim 16, wherein the sidewall protection structure is completely spaced apart from the wet etch stop layer by the sacrificial semiconductor layer.

* * * * *